(12) United States Patent
Nakao et al.

(10) Patent No.: US 7,507,666 B2
(45) Date of Patent: Mar. 24, 2009

(54) MANUFACTURE METHOD FOR SEMICONDUCTOR DEVICE HAVING CONCAVE PORTIONS FILLED WITH CONDUCTOR CONTAINING CU AS ITS MAIN COMPOSITION

(75) Inventors: Yoshiyuki Nakao, Kawasaki (JP); Hideki Kitada, Kawasaki (JP); Nobuyuki Ohtsuka, Kawasaki (JP); Noriyoshi Shimizu, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 340 days.

(21) Appl. No.: 11/294,471

(22) Filed: Dec. 6, 2005

(65) Prior Publication Data

US 2007/0049024 A1    Mar. 1, 2007

(30) Foreign Application Priority Data

Aug. 30, 2005    (JP) .............................. 2005-249651

(51) Int. Cl.
*H01L 21/4763* (2006.01)
(52) U.S. Cl. ...................... 438/687; 438/618; 438/643; 257/E21.171; 257/E21.591
(58) Field of Classification Search ................. 438/618, 438/643, 687
See application file for complete search history.

(56) References Cited

U.S. PATENT DOCUMENTS 6,288,448 B1 *  9/2001  Pramanick .................. 257/760

OTHER PUBLICATIONS

W.A. Lanford et al., "Low-Temperature passivation of copper by doping with Al or Mg", Thin Solid Films 262, pp. 234-241 (1995).
W.A. Lanford et al., "Low Temperature Passivation of Copper by Doping with Al or Mg", Thin Solid Films 262, pp. 234-241 (1995).
T. Usul et al., "Low Resistive and Highly Reliable Cu Dual-Damascene Interconnect Technology . . . ", ITTC Session 9.2, 2005.

* cited by examiner

*Primary Examiner*—Alexander G Ghyka
(74) *Attorney, Agent, or Firm*—Fujitsu Patent Center

(57) ABSTRACT

An insulating film having a concave portion is formed on a semiconductor substrate. The inner surface of the concave portion and the upper surface of the insulating film are covered with an auxiliary film made of Cu alloy containing a first metal element other than Cu. A conductive member containing Cu as a main composition is deposited on the auxiliary film, the conductive member being embedded in the concave portion. Heat treatment is performed in an atmosphere containing P compound, Si compound or B compound. With this method, a content of element other than Cu in the conductive member can be reduced and a resistivity can be lowered.

7 Claims, 7 Drawing Sheets

MANUFACTURE METHOD FOR SEMICONDUCTOR DEVICE HAVING CONCAVE PORTIONS FILLED WITH CONDUCTOR CONTAINING CU AS ITS MAIN COMPOSITION

CROSS REFERENCE TO RELATED APPLICATION

This application is based on and claims priority of Japanese Patent Application No. 2005-249651 filed on Aug. 30, 2005, the entire contents of which are incorporated herein by reference.

BACKGROUND OF THE INVENTION

A) Field of the Invention

The present invention relates to a semiconductor device manufacture method, and more particularly to a semiconductor device manufacture method having a process of forming wirings by filling concave portions formed in an insulating film with conductor having Cu as its main composition.

B) Description of the Related Art

Miniaturization of wirings and increasing of wiring layers are progressing as semiconductor elements are highly integrated and chip sizes are reduced. In a logical element having a multi-layer wiring structure, a delay of a signal transmitting along a wiring is becoming a dominant factor of lowering an operation speed of the logical element. The delay of a signal transmitting along a wiring is proportional to a product of a wiring resistance and a parasitic capacitance between wirings.

Technologies of using copper (Cu) having a low resistivity as wiring material are adopted practically in order to reduce wiring resistance. Since it is difficult to pattern a copper film by using photolithography process, a damascene method is generally adopted to form copper wirings.

When a copper wiring is formed by the damascene method, the inner surface of a wiring trench and a via hole is covered with a barrier layer before the copper film is deposited, the main object of the barrier layer being to prevent diffusion of copper into an insulating film. Refractory metal such as tantalum (Ta) and tungsten (W) is used as the material of a barrier film. Refractory metal has a resistivity higher than that of copper.

As the size of a wiring becomes fine, a ratio of the barrier layer occupying the cross section of the wiring becomes large. Therefore, the barrier layer has a large factor of raising a wiring resistance. Especially, in a fine multi-layer wiring structure having a diameter and wiring width of a via hole of 0.1 μm or smaller, it is desired to make the barrier layer as thin as possible.

Chemical vapor deposition (CVD), atomic layer deposition (ALD) and the like are considered hopeful as techniques of forming a thin barrier layer. If these film forming methods are adopted by using low dielectric constant material as the material of an interlayer insulating film, a sufficient tight adhesion cannot be obtained.

The document "Low-temperature passivation of copper by doping with Al or Mg" by W. A. Lanford et al., Thin Solid Films, 262(1995), pp. 234 to 241 discloses the technique of forming an Al oxide or Mg oxide layer on the surface of Cu by doping Al or Mg into Cu and performing heat treatment. This oxide layer functions as a protective film and diffusion preventing film for Cu.

Next, description will be made on a method of forming a thin barrier layer having a uniform thickness, disclosed in the document "Low Resistive and Highly Reliable Cu Dual-Damascene Interconnect Technology Using Self-Formed $MnSi_xO_y$ Barrier layer" by T. Usui et al., IITC 2005, Session 9.2. A seed layer of CuMn alloy is formed by sputtering on the surface of an interlayer insulating film formed with wiring trenches and via holes. Thereafter, copper is electroplated to fill the wiring groove and via hole with the copper. Heat treatment is performed to react Si and O as the constituent elements in the interlayer insulating film with Mn as the constituent element in the seed layer. A barrier layer is therefore formed at the interface between a Cu wiring and the interlayer insulating film, the barrier layer being made of $MnSi_xO_y$ compound which is very thin about 2 to 3 nm in thickness and has a uniform thickness. This barrier layer prevents diffusion of Cu.

The seed layer covering the bottom of the via hole does not contact the interlayer insulating film and contacts a lower level wiring. Therefore, the barrier layer is not formed at the interface between the copper wiring in the via hole and the lower level wiring, so that the upper and lower level wirings can be connected without the barrier layer between the upper and lower level wirings. Further, since the barrier layer made of MnSiO compound can be made thinner than a barrier layer made of refractory metal, it is possible to suppress an increase of wiring resistance.

Figure 5A:
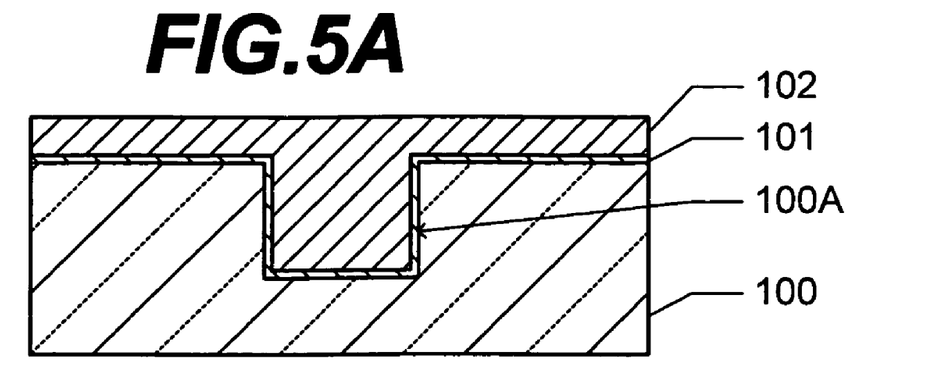
FIGS. 5A and 5B are cross sectional views illustrating a conventional method of forming a Cu wiring.
Figure 5B:
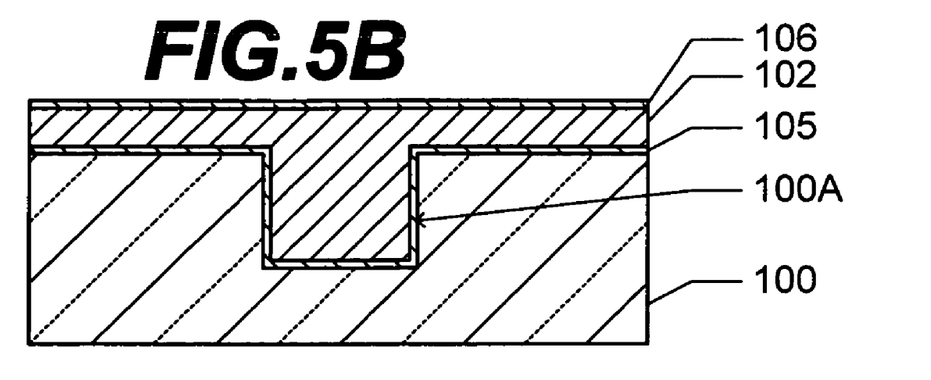

With reference to FIG. 5A and 5B, description will be made on a conventional method for forming a Cu wiring. As shown in FIG. 5A, a concave portion 100A corresponding to a wiring trench, a via hole and the like is formed in an insulating film 100 made of SiOC, porous silica or the like. The inner surface of the concave portion 100A and the upper surface of the insulating film 100 are covered with an auxiliary film 101 made of CuMn alloy. Cu is deposited on the auxiliary film 101 to form a conductive member 102 by electroplating, filling the concave portion 100A. After the conductive member 102 is formed, heat treatment is performed in an oxidizing atmosphere.

FIG. 5B is a cross sectional view of the semiconductor substrate after the heat treatment. Mn as the constituent element of the auxiliary film 101 is segregated on the surface of the insulation film 100. The segregated Mn reacts with Si and O in the insulation film 100 to form a barrier layer 105 made of MnSiO compound. Part of Mn diffuses in the conductive member 102 and reaches the surface thereof. Mn reached the surface reacts with oxygen in the heat treatment atmosphere to form a cover film 106 made of manganese oxide. In this manner, since Mn is consumed by the barrier layer 105 and cover film 106, a Mn content in the conductive member 102 can be reduced. Namely, it is possible to raise the purity of Cu of the conductive member 102 and prevent a resistivity from being increased by impurities.

Figure 6:
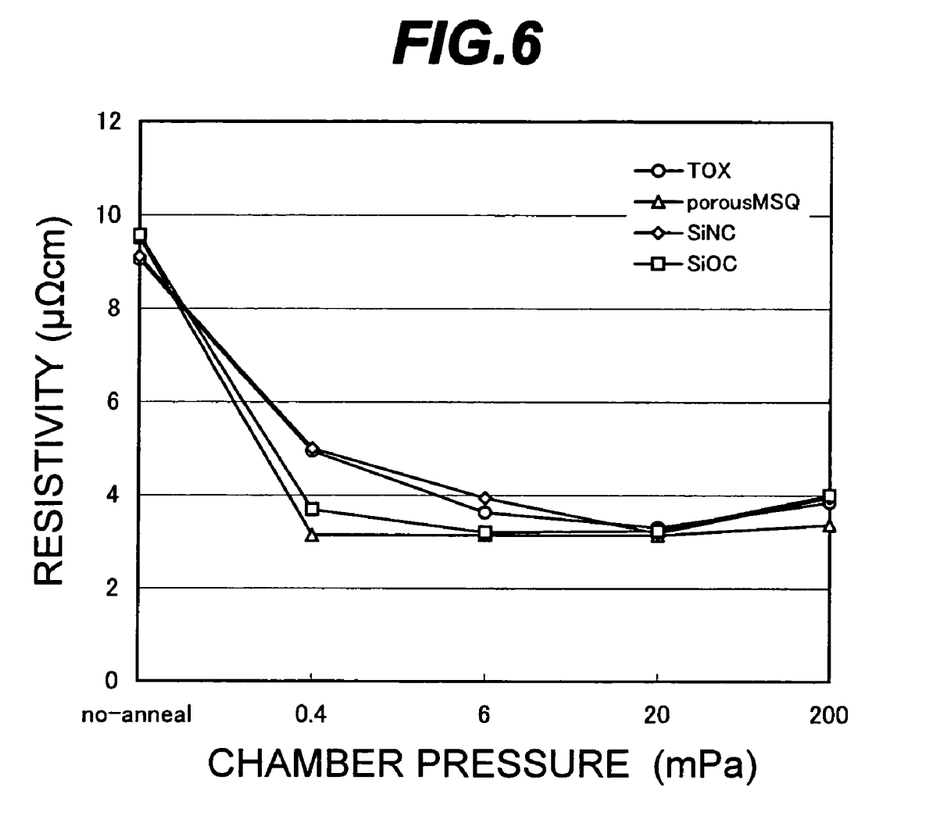
FIG. 6 is a graph showing resistivity of copper wirings formed by a conventional method.

FIG. 6 is a graph showing the relation between an in-chamber pressure during heat treatment and a resistivity of the conductive member 102 after heat treatment. The abscissa represents a pressure in the unit of "mPa", and the left end indicates no-annealing. The ordinate represents a resistivity in the unit of "μΩcm". Circle, triangle, rhombus and square symbols shown in FIG. 6 indicate the resistivity of insulating films made of thermally oxidized silicon oxide, porous methylsilsequioxane (porous MSQ), SiNC and SiOC, respectively. Heat treatment was performed at 400° C. for 30 minutes in an oxygen atmosphere.

It can be seen that heat treatment lowers the resistivity. It was anticipated that as the pressure was raised, oxidation reaction of Mn at the surface of the conductive member 102 could progress and the resistivity could be lowered. However, even if the pressure is raised, the resistivity lowered only to about 3 μΩcm. The resistivity of pure copper is about 1.67 μΩcm.

Description will be made on why the resistivity does not lower to the value of pure copper. If the cover film 106 of manganese oxide becomes thick to some extent, the cover film 106 itself suppresses diffusion of Mn and O and oxidation reaction of Mn becomes hard to occur. Mn in the conductive member 102 will not reduce further. It can be considered that since Mn is resident in the conductive member 102, the resistivity lowers only to about 3 μΩcm.

SUMMARY OF THE INVENTION

An object of the present invention is to provide a semiconductor device manufacture method capable of reducing a content of elements other than Cu in a conductive member and lowering a resistivity.

According to one aspect of the present invention, there is provided a semiconductor device manufacture method comprising steps of: (a) forming an insulating film having a concave portion, on a semiconductor substrate; (b) covering an inner surface of the concave portion and an upper surface of the insulating film with an auxiliary film made of Cu alloy containing a first metal element other than Cu; (c) depositing a conductive member containing Cu as a main composition on the auxiliary film, the conductive member being embedded in the concave portion; and (d) performing heat treatment in an atmosphere containing P compound, Si compound or B compound.

According to another aspect of the present invention, there is provided a semiconductor device manufacture method comprising steps of: (p) forming an insulating film having a concave portion, on a semiconductor substrate; (q) forming an auxiliary film made of Cu alloy containing a first metal element other than Cu by sputtering under a substrate temperature of 100° C. or higher, the auxiliary film covering an inner surface of the concave portion and an upper surface of the insulating film; and (r) depositing a conductive member containing Cu as a main composition on the auxiliary film by electroplating, the conductive member being embedded in the concave portion.

With the heat treatment at the step (d), atoms of the first metal element in the auxiliary film diffuse up to the surface of the conductive member and react with P, Si, B or the like to form a cover film made of phosphide, silicide, or boride. It is therefore possible to reduce the content of the first metal element in the conductive member.

While the auxiliary film is formed at the step (q) by heating the substrate, a metal element other than Cu in the auxiliary film under formation reacts with an element in the insulating film to form a reaction film. A purity of Cu in an upper layer portion of the auxiliary film improves and a resistivity lowers. By performing electroplating by using the low resistance auxiliary film as an electrode, the characteristics of the deposited conductive member can be improved.

DESCRIPTION OF THE PREFERRED EMBODIMENTS

Figure 1:
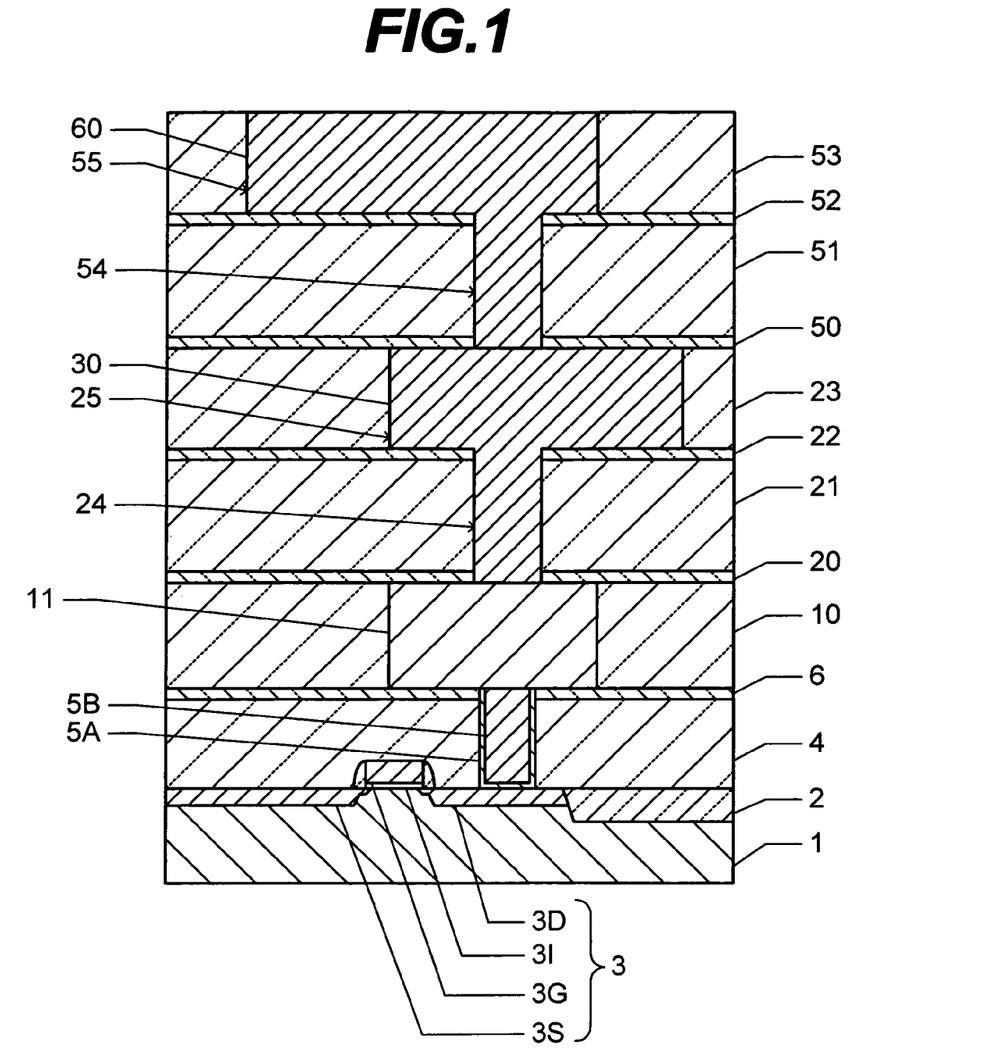
FIG. 1 is a cross sectional view of a semiconductor device to be manufactured by a semiconductor device manufacture method according to an embodiment.

FIG. 1 is a schematic cross sectional view of a semiconductor device to be manufactured by the embodiment methods. An element isolation insulating film 2 of a shallow trench isolation (STI) structure is formed in a surface layer of a semiconductor substrate 1 of silicon, to define active regions. A MOS transistor 3 is formed in an active region. The MOS transistor 3 is constituted of a source region 3S, a drain region 3D, a gate insulating film 31 and a gate electrode 3G.

An interlayer insulating film 4 of silicon oxide having a thickness of 300 nm and a protective film 6 of SiOC having a thickness of 50 nm are formed on the semiconductor substrate 1, covering the MOS transistor 3. A via hole is formed through the protective film 6 and interlayer insulating film 4, and a partial surface of the drain region 3D is exposed on the bottom of the via hole. A conductive plug 5B of tungsten (W) is embedded in the via hole. A barrier metal layer 5A of TiN having a thickness of 25 nm is disposed between the conductive plug 5B and the inner surface of the via hole.

The structure described above can be formed by well-known photolithography, etching, chemical vapor deposition (CVD), chemical mechanical polishing (CMP) and the like.

An interlayer insulating film 10 made of low dielectric constant insulating material is formed on the protective film 6. A wiring trench is formed in the interlayer insulating film 10, reaching the bottom of the film 10 and passing over the conductive plug 5B. A first layer copper wiring 11 is embedded in the wiring trench. The copper wiring 11 is connected to the conductive plug 5B.

A cap film 20, a via interlayer insulating film 21, an etching stopper film 22 and a wiring interlayer insulating film 23 are formed on and over the interlayer insulating film 10 in the order recited.

A wiring trench 25 is formed in the wiring interlayer insulating film 23, and a via hole 24 is formed in the via interlayer insulating film 21. The wiring trench 25 reaches the upper surface of the etching stopper film 22. The via hole 24 opens on the bottom of the wiring trench 25 and reaches the upper surface of the lower level wiring 11 through the cap film 20.

A conductive member 30 of copper or copper alloy is embedded in the wiring trench 25 and via hole 24. The conductive member 30 is connected to the first layer wiring 11 to constitute a second layer wiring. The detailed structure including the barrier layer will be later described in each of the embodiments.

A cap film 50, a via interlayer insulating film 51, an etching stopper film 52 and a wiring interlayer insulating film 53 are stacked on the wiring interlayer insulating film 23. Similar to the second level wiring structure, a wiring trench 55 and a via hole 54 are formed and a conductive member 60 is deposited therein. The conductive member 60 constitutes a third layer wiring.

With reference to FIGS. 2A to 2F, description will be made on a semiconductor device manufacture method according to the first embodiment. In this embodiment, attention is paid to the process of forming the second layer wiring structure from the cap film 20 to the interlayer insulating film 23. The second layer wiring structure is formed by a dual damascene method. The third layer wiring structure is formed by the same method as that used for the second layer wiring structure. The first layer wiring 11 is formed by a single damascene method different from the dual damascene method, but a barrier layer forming method, a method of depositing a conductive member in the wiring trench and other methods are the same as those adopted by the method of forming the second layer wiring structure.

Figure 2A:
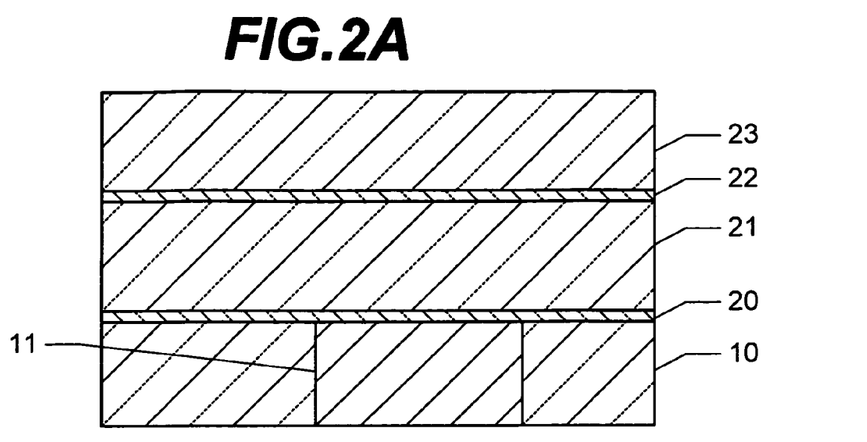
FIGS. 2A to 2F are cross sectional views of a semiconductor device during manufacture illustrating a semiconductor device manufacture method according to a first embodiment.

As shown in FIG. 2A, a cap film 20, a via interlayer insulating film 21, an etching stopper film 22 and a wiring interlayer insulating film 23 are sequentially formed on an interlayer insulating film 10. For example, the cap film 20 has a two-layer structure of a silicon oxide (SiO) film and a silicon carbide (SiC) film, and has a total thickness of 20 to 70 nm. For example, the etching stopper film 22 is made of SiC or silicon nitride (SiN) and has a thickness of 20 to 70 nm. These films can be formed by CVD.

The interlayer insulating films 21 and 23. are made of organic or inorganic low dielectric constant insulating material and have a thickness of 300 to 700 nm. The inorganic low dielectric constant insulating material may be porous silica or SiOC. The organic low dielectric constant insulating material may be SiLK (registered trademark) manufactured by the Dow Chemical Company. These materials contain Si and O as the constituent elements.

Figure 2B:
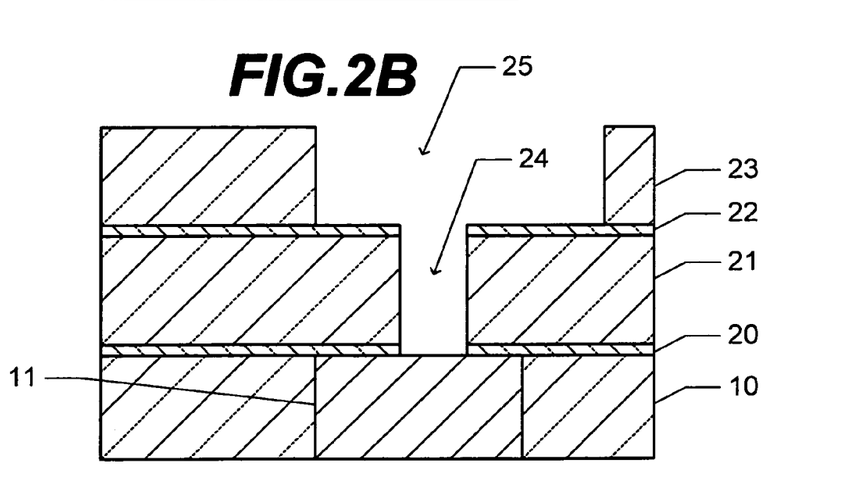

As shown in FIG. 2B, a wiring trench 25 is formed in the wiring interlayer insulating film 23, and a via hole 24 is formed in the via interlayer insulating film 21. For example, the size of the via hole 24 in a plan cross section is 0.06 to 0.1 µm and a minimum width of the wiring trench 25 is 0.06 µm. The wiring trench 25 and via hole 24 can be formed by dry etching using CF-containing etching gas and by using a hard mask constituted of, for example, two layers of an SiO film and an SiC film. The wiring trench 25 reaches the upper surface of the etching stopper film 22, and the via hole 24 reaches the upper surface of the first layer wiring 11.

Figure 2C:
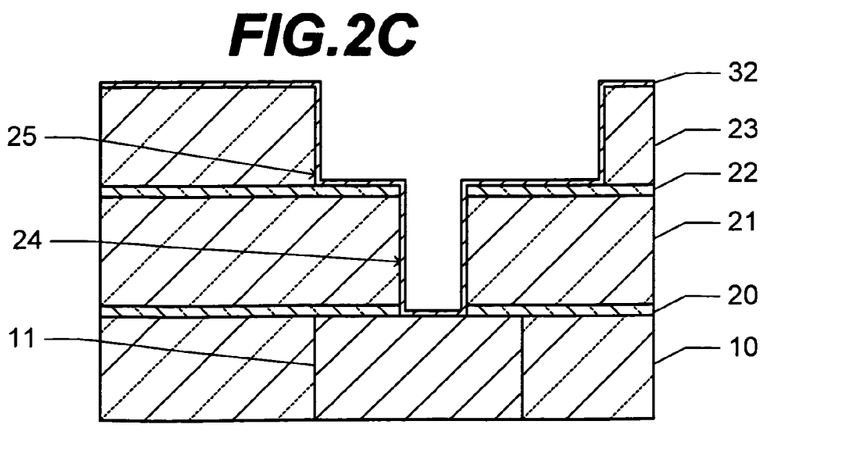

As shown in FIG. 2C, an auxiliary film 32 of CuMn alloy is formed by sputtering, covering the upper surface of the wiring interlayer insulating film 23, the inner surface of the wiring trench 25 and the inner surface of the via hole 24. A content of Mn in the auxiliary film 32 is set to 0.05 to 10 atom %. The Mn content of the auxiliary film 32 can be controlled by adjusting an Mn concentration of a target to be used. A thickness of the auxiliary film 32 is set to 5 nm to 150 nm.

Figure 2D:
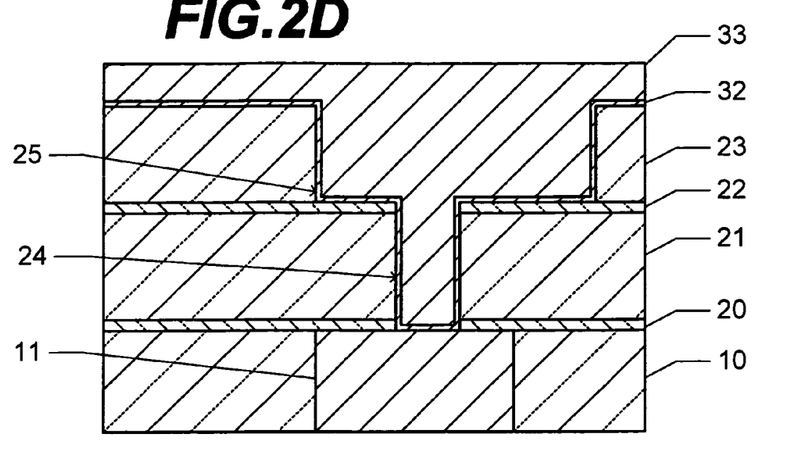

As shown in FIG. 2D, copper (Cu) is electroplated to a thickness of about 1 µm by using the auxiliary film 32 as an electrode. As a result, a conductive member 33 of Cu is deposited in the via hole 24 and wiring groove 25 and deposited on the interlayer insulating film 23.

After the conductive member 33 is deposited, thermal annealing is performed for 5 minutes at a temperature of 400° C. in an atmosphere of inert gas, e.g. nitrogen or Ar, added with $B_2H_6$. An annealing temperature may be set in the range of 200° C. to 400° C. and an annealing time may be set to 1 minute to 30 minutes.

Figure 2E:
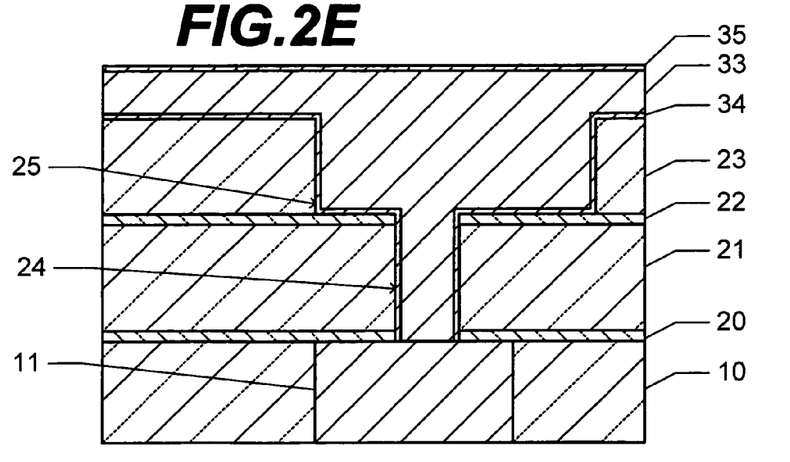

FIG. 2E shows the state after annealing. Mn atoms in the auxiliary film 32 are segregated on the inner surface of the wiring trench 25 and via hole 24. The segregated Mn reacts with Si and O constituting the interlayer insulating films 21 and 23 and etching stopperfilm 22, so that a barrier layer 34 of $MnSi_xO_y$ is formed. The barrier layer 34 prevents Cu diffusion and improves adhesion of the conductive member 33. Mn atoms diffused in the conductive member 33 and reached the surface thereof react with boron to form a cover film 35 made of manganese boride (MnB). Since Mn in the conductive member 33 is consumed for forming the cover film 35, a content of Mn in the conductive member 23 reduces. Since Mn is diffuses, the auxiliary film 32 extinguishes.

Figure 2F:
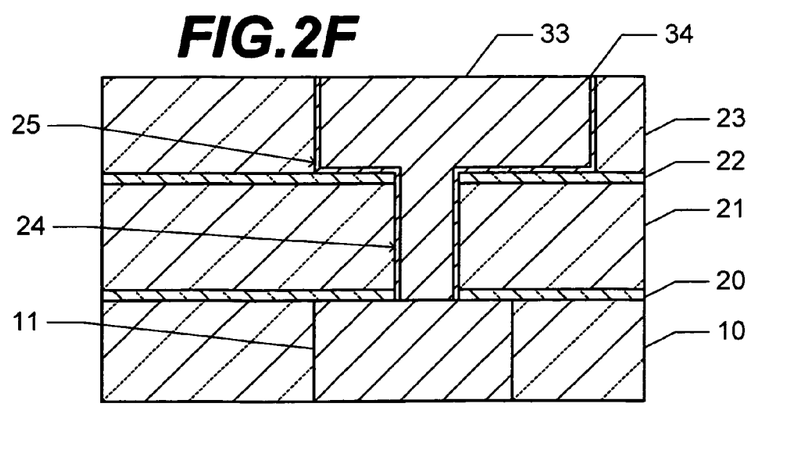

As shown in FIG. 2F, an unnecessary conductive member 33 is removed by chemical mechanical polishing (CMP). The conductive member 33 left in the wiring trench 25 and via hole 24 constitutes the second layer wiring which serves as an interlayer interconnect member between the first and second layer wirings.

In the first embodiment, the barrier layer 34 and cover film 35 are formed by annealing in the atmosphere of inert gas added with $B_2H_6$. Instead of $B_2H_6$, annealing may be performed in an atmosphere added with $PH_3$. If $PH_3$ is added, a cover film 35 is made of manganese phosphide ($Mn_3P_2$, MnP, etc.).

Figure 3:
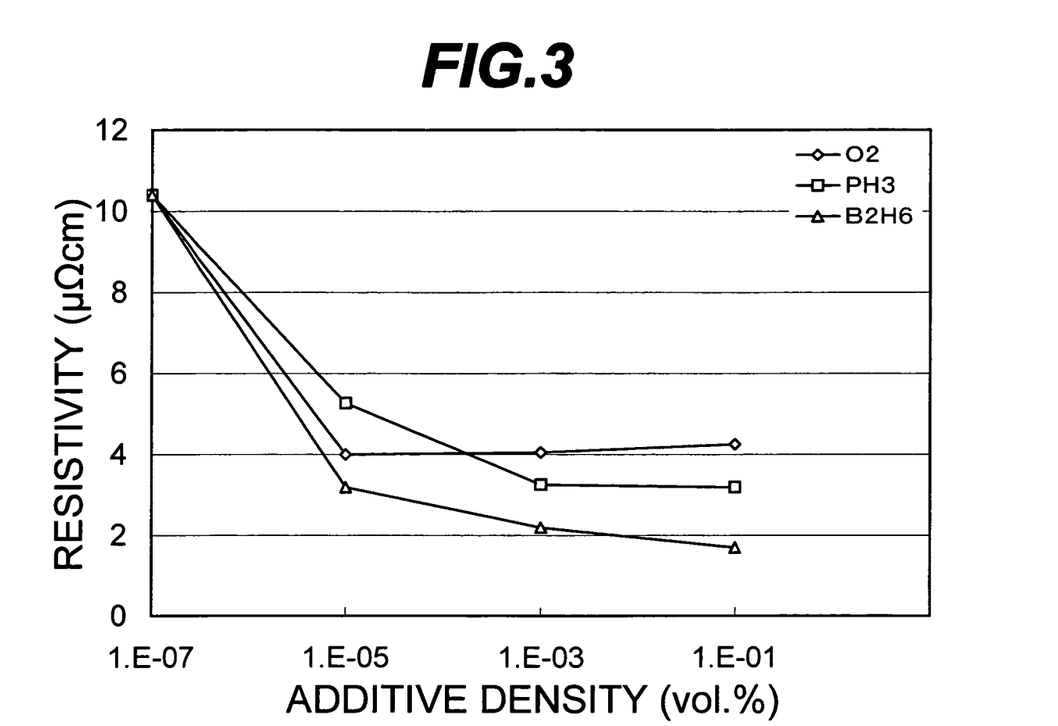
FIG. 3 is a graph showing resistivity of conductive members formed by the first embodiment and prior art.

FIG. 3 is a graph showing the relation between a concentration of additive in an annealing atmosphere and a resistivity of the conductive member 33 after annealing. The abscissa represents an additive concentration in an annealing atmosphere in the unit of "volume %" and the ordinate represents a resistivity of the conductive member 33 in the unit of "µΩcm". Triangle and square symbols in FIG. 3 indicate resistivity of the conductive member when using $B_2H_6$ and $PH_3$ as additive. For comparison, resistivity of the conductive member with oxygen being added to the annealing atmosphere is indicated by rhombus symbols. The annealing temperature was 300° C. and the annealing time was 30 minutes.

When oxygen is added, the resistivity will not lower even if the additive concentration is increased in the range of $1\times10^{-5}$ volume % or higher, and is generally constant at 4 µΩcm. In contrast, when $B_2H_6$ or $PH_3$ is added, the resistivity lowers as the additive concentration is increased, and can be lowered less than 4 µΩcm. When $PH_3$ is added, the resistivity can be lowered to 3.3 µΩcm or lower by setting the additive concentration to $1\times10^{-3}$ volume % or higher. In order to obtain a lower resistivity than prior art, it is preferable to set the $PH_3$ concentration to $1\times10^{-3}$ volume % or higher. When $B_2H_6$ is added, the resistivity can be lowered to about 3 µΩcm even at the additive concentration of $1\times10^{-5}$ volume %. The resistivity can be lowered to about 2 µΩcm by setting the additive concentration to $1\times10^{-3}$ volume % or higher. The resistivity can be lowered to 2 µΩcm or lower by setting the additive concentration to 0.1 volume % or higher. In order to obtain a lower resistivity than prior art, it is preferable to set the $B_2H_6$ concentration to $1\times10^{-5}$ volume % or higher.

In the first embodiment described above, although $B_2H_6$ is used as the additive for forming manganese boride, other compounds containing boron may also be used such as triethoxyborate ($B(OC_2H_5)_3$) or trimethoxyborate ($B(OCH_3)_3$). Although $PH_3$ is used as the additive for forming manganese phosphide, other compounds containing phosphorus may also be used such as trimethylphosphine (($CH_3)_3P$), tertiary-butylphosphine (t-$C_4H_9PH_2$) or trimethylphosphite ($P(OCH_3)_3$).

In the above-described first embodiment, although the cover film 35 is made of manganese boride or manganese phosphide, it may be made of manganese silicide ($Mn_2Si$, MnSi, etc.). In order to form the cover film 35 of manganese silicide, annealing is performed in an atmosphere of inert gas added with silicon compound such as silane ($SiH_4$), disilane ($Si_2H_6$) or tetramethylsilane (($CH_3)_4Si$).

The cover film 35 may be made of manganese oxysilicide. In order to form the cover film 35 of manganese oxysilicide, siloxane, tetraetoxysilane ($Si(OC_2H_5)_4$), tetramethoxysilane ($Si(OCH_3)_4$) or the like is added to an annealing atmosphere.

Examples of usable siloxane include 1, 1, 3, 3-tetramethyldisiloxane, pentamethyidisiloxane, hexamethyldisiloxane (MM), octamethyltrisiloxane (MDM), hexamethylcyclosiloxane (D3), octamethylcyclotetrasiloxane (D4), decamethylcyclopentasiloxane (D5), dodecamethycyclohexasilocane (D6) and the like.

According to conventional examples, the barrier layer 34 of MnSiO is formed by reaction between the interlayer insulating film 21, etc. and the auxiliary film 32, whereas the cover film 35 is formed by reaction between the conductive member 23 and source gas. The cover film 35 of MnSiO also contains H and C contained in the source gas. Therefore, the cover film 35 is not denser than the barrier layer 34 and the reaction between Mn in the conductive member 23 and Si and O in the source gas is not hindered.

In order to sufficiently reduce the resistivity of the conductive member 33, it is preferable to set the concentration of additive in the annealing atmosphere to 0.1 volume % or higher.

In the first embodiment, the cover film 35 formed in the process shown in FIG. 2E is made of manganese boride, manganese phosphide, manganese silicide or manganese oxysilicide. More generally, additives in the auxiliary film 32 and in the annealing atmosphere are selected in such a manner that a standard enthalpy of formation of the material of the cover film 35, i.e., boride, phosphide, silicide, or oxysilicide of a metal element other than Cu constituting the auxiliary film 32 is smaller than a standard enthalpy of formation of oxide of the metal element. Since the standard enthalpy of formation of oxide is low, the cover film 35 can be formed at a lower temperature than the film formed by annealing in the oxygen atmosphere. Namely, metal elements other than Cu in the conductive member 33 are likely to be consumed by the cover film 35 so that a purity of the conductive member 33 can be raised.

Figure 4A:
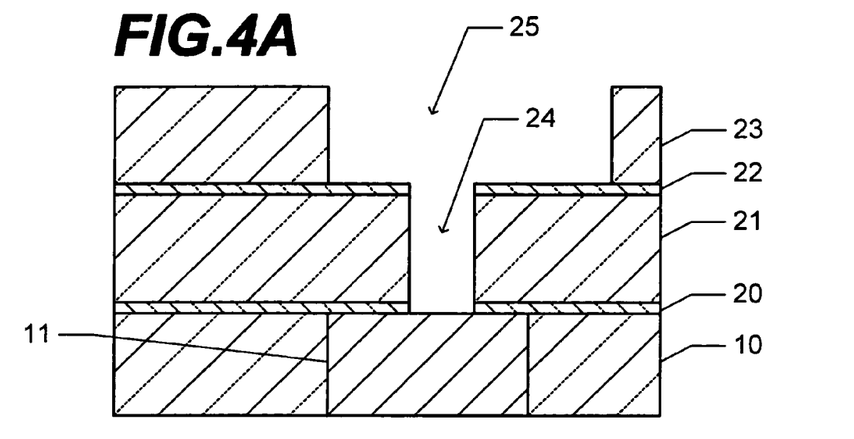
FIGS. 4A to 4C are cross sectional views of a semiconductor device during manufacture illustrating a semiconductor device manufacture method according to a first embodiment.

Next, with reference to FIGS. 4A to 4C, description will be made on a semiconductor device manufacture method according to the second embodiment. A cross sectional view shown in FIG. 4A is the same as that of FIG. 2B illustrating the manufacture method of the first embodiment.

Processes up to the state shown in FIG. 4B will be described. While a semiconductor substrate is heated in a temperature range of 100° C. to 300° C., an auxiliary film 36 having a thickness of 5 nm to 150 nm is formed by sputtering using a CuMn alloy target. An Mn concentration of the target is set to 0.1 atom % to 10 atoms %. Since the semiconductor substrate is heated during the film forming, Mn in CuMn alloy reacts with Si and O in an interlayer insulating film 23 and an etching stopper film 22 to form a barrier layer 36a of MnSiO. Since Mn is segregated on the surfaces of the interlayer insulating film 23 and etching stopper film 22, an Mn concentration in an upper layer portion 36b of the auxiliary film 36 lowers.

Figure 4B:
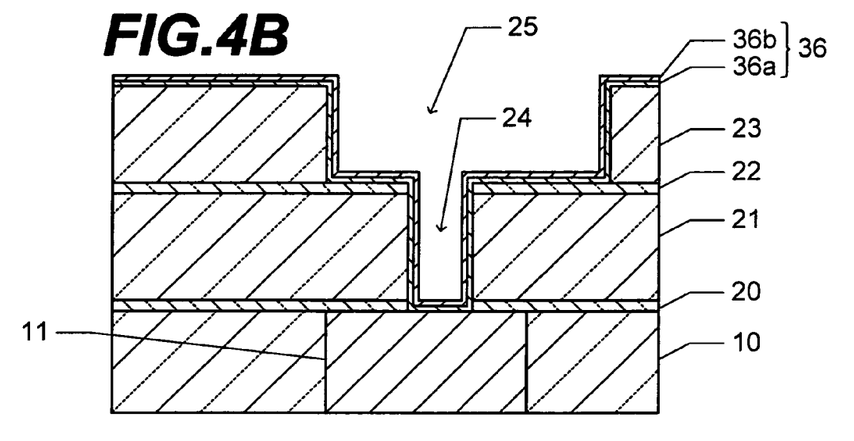
Figure 4C:
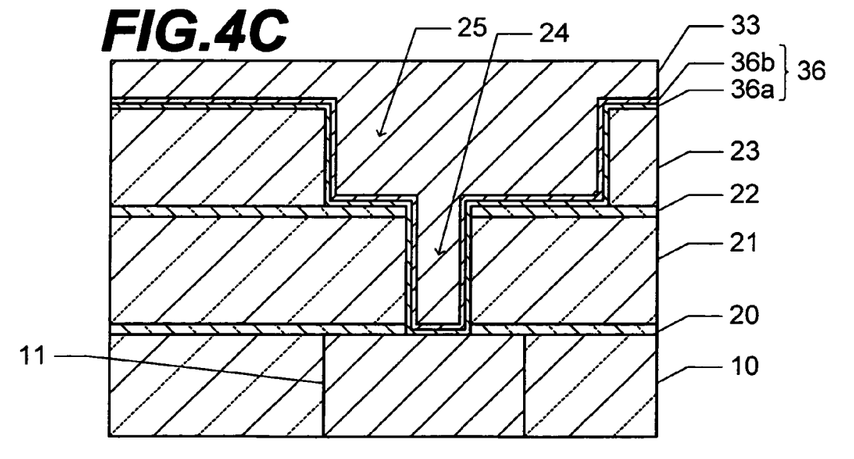

As shown in FIG. 4C, copper is electroplated by using the upper layer portion 36b of the auxiliary film 36 as an electrode, to form a conductive member 33. The processes after the conductive member 33 is formed are the same as the processes described with reference to FIGS. 2E and 2F illustrating the manufacture method of the first embodiment.

While the substrate temperature was raised to 200° C., a CuMn alloy layer having a thickness of 90 nm was formed, and the resistivity of the formed CuMn alloy layer was 5.2 μΩcm. In contrast, the resistivity of a CuMn alloy layer formed at a substrate temperature of 25° C. without heating the substrate was 9.7 μΩcm. The resistivity of the CuMn alloy layer can be lowered by heating the substrate. As described with the process shown in FIG. 4B, this is because Mn is segregated on the surfaces of the interlayer insulating film 23 and etching stopper film 22 and a purity of Cu in the upper layer portion is improved.

As described above, since the resistivity of the auxiliary film 36 shown in FIG. 4B lowers, it is possible to improve the characteristics of the conductive member 33 formed by electroplating using the auxiliary film 36 as the electrode. Specifically, an in-plane uniformity of the conductive member 33 can be improved.

In the embodiments described above, the auxiliary film 32 shown in FIG. 2C and the auxiliary film 36 shown in FIG. 4B are made of CuMn alloy. Instead, the auxiliary film may be made of Cu alloy containing metal other than Mn, the metal being capable of forming a thin and uniform thickness oxide layer at the interface between the conductive member and interlayer insulating film and having a greater tendency to form compound by segregating on the surface of the conductive member or at the interface to the interlayer insulating film than forming solid solution with Cu. Such metal element may be Al, Mg or Ni. By adopting the Cu alloy of this type as the material of the auxiliary film 32, it is possible to suppress an increase in wiring resistance.

The present invention has been described in connection with the preferred embodiments. The invention is not limited only to the above embodiments. It will be apparent to those skilled in the art that other various modifications, improvements, combinations, and the like can be made.

What we claim are:

1. A semiconductor device manufacture method comprising:
    (a) forming an insulating film having a concave portion, on a semiconductor substrate;
    (b) covering an inner surface of the concave portion and an upper surface of the insulating film with an auxiliary film made of Cu alloy containing a first metal element other than Cu;
    (c) depositing a conductive member containing Cu as a main composition on the auxiliary film, the conductive member being embedded in the concave portion;
    (d) performing heat treatment in an atmosphere containing P compound, Si compound or B compound; and
    (e) after the heat treatment, removing a portion of the conductive member by chemical mechanical polishing such that another portion of the conductive member is left in the concave portion.

2. The semiconductor device manufacture method according to claim 1, wherein the first metal element is at least one metal element selected from a group consisting of Mn, Al, Mg and Ni.

3. The semiconductor device manufacture method according to claim 1, wherein a standard generation enthalpy of phosphide, silicide, oxysilicide or boride of the first metal element generated at the step (d) is smaller than a standard generation enthalpy of oxide of the first metal element.

4. The semiconductor device manufacture method according to claim 1, wherein the step (d) performs the heat treatment in the atmosphere containing at least one compound selected from a group consisting of $PH_3$, $(CH_3)_3P$, $t-C_4H_9PH_2$, $P(OCH_3)_3$, $SiH_4$, $Si_2H_6$, $(CH_3)_4Si$, $Si(OC_2H_5)_3$, $Si(OCH_3)_4$, siloxane, $B_2H_6$, $B(OC_2H_5)_3$ and $B(OCH_3)_3$.

5. The semiconductor device manufacture method according to claim 1, wherein said step (b) forms the auxiliary film by sputtering under a substrate temperature condition of 100° C. or higher.

6. The semiconductor device manufacture method according to claim 5, wherein said step (b) forms the auxiliary film under a substrate temperature of 300° C. or lower.

7. The semiconductor device manufacture method according to claim 1, wherein, in the step (d), the first metal element diffusing in the conductive member and reaching a surface of the conductive member reacts with P, Si or B in the atmosphere to form a cover film comprising the first metal element and an element selected from a group consisting of P, Si and B.

\* \* \* \* \*